(12) United States Patent
Bernhardt et al.

(10) Patent No.: US 10,103,326 B2
(45) Date of Patent: Oct. 16, 2018

(54) CONDUCTIVE HARD MASK FOR MEMORY DEVICE FORMATION

(71) Applicant: Micron Technology, Inc., Boise, ID (US)

(72) Inventors: Michael Bernhardt, Boise, ID (US); Tony Lindenberg, Boise, ID (US); Wenzhe Zhang, Boise, ID (US); Douglas Capson, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/855,657

(22) Filed: Dec. 27, 2017

(65) Prior Publication Data

US 2018/0138400 A1    May 17, 2018

Related U.S. Application Data

(62) Division of application No. 15/068,185, filed on Mar. 11, 2016, now Pat. No. 9,923,139.

(51) Int. Cl.
| | |
|---|---|
| H01L 45/00 | (2006.01) |
| G11C 13/00 | (2006.01) |
| C23F 3/00 | (2006.01) |
| H01L 23/528 | (2006.01) |
| H01L 27/24 | (2006.01) |

(52) U.S. Cl.
CPC .......... *H01L 45/06* (2013.01); *C23F 3/00* (2013.01); *G11C 13/003* (2013.01); *G11C 13/0004* (2013.01); *G11C 13/004* (2013.01); *G11C 13/0007* (2013.01); *G11C 13/0026* (2013.01); *G11C 13/0028* (2013.01); *G11C 13/0069* (2013.01); *H01L 23/528* (2013.01); *H01L 27/2409* (2013.01); *H01L 27/2481* (2013.01); *H01L 45/126* (2013.01); *H01L 45/1233* (2013.01); *H01L 45/1253* (2013.01); *H01L 45/141* (2013.01); *H01L 45/142* (2013.01); *H01L 45/143* (2013.01); *H01L 45/144* (2013.01); *H01L 45/1608* (2013.01); *H01L 45/1675* (2013.01); *G11C 2013/005* (2013.01); *G11C 2013/0045* (2013.01);
(Continued)

(58) Field of Classification Search
CPC ................... H01L 45/04; H01L 45/06
See application file for complete search history.

(56) References Cited

U.S. PATENT DOCUMENTS

| | | | |
|---|---|---|---|
| 7,390,691 B2 * | 6/2008 | Dennison | ............... H01L 45/06 257/E27.004 |
| 7,400,006 B1 * | 7/2008 | Rinerson | ............ G11C 11/5685 257/295 |

(Continued)

*Primary Examiner* — Earl Taylor
(74) *Attorney, Agent, or Firm* — Holland & Hart LLP

(57) ABSTRACT

Methods, systems, and devices for memory arrays that use a conductive hard mask during formation and, in some cases, operation are described. A hard mask may be used to define features or components during the numerous material formation and removal steps used to create memory cells within a memory array. The hard mask may be an electrically conductive material, some or all of which may be retained during formation. A conductive line may be connected to each memory cell, and because the hard mask used in forming the cell may be conductive, the cell may be operable even if portions of the hard mask remain after formation.

20 Claims, 10 Drawing Sheets

(52) U.S. Cl.
CPC .. *G11C 2013/0078* (2013.01); *G11C 2213/71* (2013.01); *H01L 27/2418* (2013.01); *H01L 27/2427* (2013.01)

(56) References Cited

U.S. PATENT DOCUMENTS

| | | | | |
|---|---|---|---|---|
| 7,439,082 B2* | 10/2008 | Rinerson | G11C 11/5685 | 257/E21.664 |
| 7,575,984 B2* | 8/2009 | Radigan | H01L 27/1021 | 438/131 |
| 7,764,534 B2* | 7/2010 | Thorp | G11C 13/0004 | 365/105 |
| 7,985,676 B2* | 7/2011 | Klee | H01L 21/0337 | 257/E21.585 |
| 8,530,878 B2* | 9/2013 | Smythe | H01L 27/2409 | 257/4 |
| 8,835,889 B1* | 9/2014 | Abraham | H01L 43/08 | 257/2 |
| 8,952,350 B2* | 2/2015 | Murase | H01L 45/146 | 257/4 |
| 9,082,967 B2* | 7/2015 | Murase | H01L 45/146 | |
| 9,299,747 B1 | 3/2016 | Pellizzer et al. | | |
| 9,443,910 B1* | 9/2016 | Fujiwara | H01L 27/2481 | |
| 9,450,023 B1* | 9/2016 | Konevecki | H01L 27/2454 | |
| 9,705,080 B2* | 7/2017 | Tortorelli | H01L 45/12 | |
| 9,741,764 B1* | 8/2017 | Terai | H01L 27/2427 | |
| 2006/0099722 A1* | 5/2006 | Mitsui | H01L 28/57 | 438/3 |
| 2006/0255386 A1* | 11/2006 | Ueda | H01L 21/31116 | 257/296 |
| 2007/0070690 A1* | 3/2007 | Scheuerlein | G11C 11/5685 | 365/171 |
| 2007/0072360 A1* | 3/2007 | Kumar | G11C 11/5692 | 438/237 |
| 2007/0164309 A1* | 7/2007 | Kumar | G11C 11/5692 | 257/142 |
| 2007/0164388 A1* | 7/2007 | Kumar | G11C 11/5692 | 257/458 |
| 2007/0190722 A1* | 8/2007 | Herner | G11C 5/02 | 438/257 |
| 2007/0284656 A1* | 12/2007 | Radigan | H01L 27/1021 | 257/328 |
| 2008/0007989 A1* | 1/2008 | Kumar | G11C 11/5692 | 365/148 |
| 2008/0013364 A1* | 1/2008 | Kumar | G11C 5/02 | 365/148 |
| 2008/0017912 A1* | 1/2008 | Kumar | G11C 5/02 | 257/314 |
| 2008/0023790 A1* | 1/2008 | Scheuerlein | G11C 11/56 | 257/530 |
| 2008/0025062 A1* | 1/2008 | Scheuerlein | G11C 11/5685 | 365/105 |
| 2008/0025069 A1* | 1/2008 | Scheuerlein | G11C 17/16 | 365/148 |
| 2008/0025118 A1* | 1/2008 | Scheuerlein | G11C 11/56 | 365/201 |
| 2008/0076244 A1* | 3/2008 | Ye | H01L 21/31144 | 438/597 |
| 2008/0237599 A1* | 10/2008 | Herner | B82Y 10/00 | 257/66 |
| 2008/0239787 A1* | 10/2008 | Herner | B82Y 10/00 | 365/148 |
| 2008/0239790 A1* | 10/2008 | Herner | B82Y 10/00 | 365/151 |
| 2008/0316795 A1* | 12/2008 | Herner | G11C 11/36 | 365/148 |
| 2008/0316796 A1* | 12/2008 | Herner | G11C 11/36 | 365/148 |
| 2008/0316808 A1* | 12/2008 | Herner | G11C 11/36 | 365/175 |
| 2008/0316809 A1* | 12/2008 | Herner | G11C 11/5692 | 365/175 |
| 2009/0001343 A1* | 1/2009 | Schricker | H01L 27/2409 | 257/4 |
| 2009/0001345 A1* | 1/2009 | Schricker | G11C 13/0004 | 257/4 |
| 2009/0086521 A1* | 4/2009 | Herner | G11C 11/5685 | 365/63 |
| 2009/0091037 A1* | 4/2009 | Assefa | H01L 43/12 | 257/773 |
| 2009/0166609 A1* | 7/2009 | Schricker | B82Y 10/00 | 257/40 |
| 2009/0166610 A1* | 7/2009 | Schricker | B82Y 10/00 | 257/40 |
| 2009/0168491 A1* | 7/2009 | Schricker | B82Y 10/00 | 365/148 |
| 2009/0256131 A1* | 10/2009 | Schricker | B82Y 10/00 | 257/4 |
| 2009/0257270 A1* | 10/2009 | Schricker | H01L 45/04 | 365/148 |
| 2009/0278112 A1* | 11/2009 | Schricker | H01L 21/31138 | 257/9 |
| 2009/0283736 A1* | 11/2009 | Kanzawa | G11C 13/0007 | 257/2 |
| 2010/0006811 A1* | 1/2010 | Xu | H01L 27/101 | 257/2 |
| 2010/0012912 A1* | 1/2010 | Schricker | H01L 27/101 | 257/2 |
| 2010/0020592 A1* | 1/2010 | Hosotani | G11C 11/161 | 365/158 |
| 2010/0044671 A1* | 2/2010 | Schricker | B82Y 10/00 | 257/4 |
| 2010/0059730 A1* | 3/2010 | Ito | H01L 27/101 | 257/2 |
| 2010/0072445 A1* | 3/2010 | Schricker | B82Y 10/00 | 257/2 |
| 2010/0108976 A1* | 5/2010 | Jayasekara | B82Y 10/00 | 257/4 |
| 2010/0108981 A1* | 5/2010 | Jayasekara | B82Y 10/00 | 257/5 |
| 2010/0108982 A1* | 5/2010 | Ping | B82Y 10/00 | 257/5 |
| 2010/0163824 A1* | 7/2010 | Xu | G11C 13/00 | 257/2 |
| 2010/0207168 A1* | 8/2010 | Sills | H01L 27/2418 | 257/202 |
| 2010/0232200 A1* | 9/2010 | Shepard | G11C 13/0004 | 365/51 |
| 2011/0001110 A1* | 1/2011 | Takahashi | H01L 27/2436 | 257/2 |
| 2011/0095257 A1* | 4/2011 | Xu | H01L 21/02115 | 257/3 |
| 2011/0127484 A1* | 6/2011 | Yasutake | G11C 13/0002 | 257/2 |
| 2011/0147691 A1* | 6/2011 | Yasutake | G11C 13/0004 | 257/2 |
| 2011/0193042 A1* | 8/2011 | Maxwell | B82Y 10/00 | 257/1 |
| 2011/0194341 A1* | 8/2011 | Gaidis | G11C 11/16 | 365/171 |
| 2011/0233500 A1* | 9/2011 | Nishimura | H01L 27/2409 | 257/2 |
| 2011/0233501 A1* | 9/2011 | Sonehara | G11C 13/0004 | 257/2 |
| 2011/0233507 A1* | 9/2011 | Sonehara | H01L 27/224 | 257/4 |
| 2011/0278529 A1* | 11/2011 | Xu | B82Y 10/00 | 257/2 |
| 2012/0001150 A1* | 1/2012 | Schricker | B82Y 10/00 | 257/9 |
| 2012/0199805 A1* | 8/2012 | Sorada | H01L 27/101 | 257/4 |
| 2012/0223414 A1* | 9/2012 | Schricker | B82Y 10/00 | 257/532 |
| 2012/0224413 A1* | 9/2012 | Zhang | B82Y 10/00 | 365/148 |
| 2013/0075685 A1* | 3/2013 | Li | G11C 13/0002 | 257/3 |

(56) References Cited

U.S. PATENT DOCUMENTS

| | | | | |
|---|---|---|---|---|
| 2013/0112935 A1* | 5/2013 | Himeno | H01L 45/1253 | 257/4 |
| 2013/0140515 A1* | 6/2013 | Kawashima | H01L 45/085 | 257/4 |
| 2013/0328201 A1* | 12/2013 | Wang | H01L 23/481 | 257/762 |
| 2014/0001525 A1* | 1/2014 | Kajiyama | H01L 29/78 | 257/295 |
| 2014/0097396 A1* | 4/2014 | Murase | H01L 45/146 | 257/2 |
| 2014/0098459 A1* | 4/2014 | Lee | H01L 28/60 | 361/306.1 |
| 2014/0145136 A1* | 5/2014 | Murase | H01L 45/146 | 257/2 |
| 2014/0248763 A1* | 9/2014 | Konevecki | H01L 21/28008 | 438/591 |
| 2014/0252298 A1* | 9/2014 | Li | H01L 45/1616 | 257/4 |
| 2015/0287910 A1* | 10/2015 | Lu | H01L 43/02 | 257/421 |
| 2016/0020386 A1* | 1/2016 | Kim | C23C 14/3492 | 204/192.2 |
| 2016/0072045 A1* | 3/2016 | Kanaya | H01L 43/08 | 257/427 |
| 2016/0141334 A1* | 5/2016 | Takaki | H01L 27/249 | 257/5 |
| 2016/0247813 A1* | 8/2016 | Lai | H01L 27/11582 | |
| 2016/0300885 A1* | 10/2016 | Konevecki | H01L 27/2454 | |
| 2016/0351799 A1* | 12/2016 | Xue | H01L 43/12 | |
| 2017/0263862 A1* | 9/2017 | Bernhardt | H01L 45/06 | |

* cited by examiner

400

CONDUCTIVE HARD MASK FOR MEMORY DEVICE FORMATION

CROSS REFERENCE

The present Application for Patent is a divisional of U.S. patent application Ser. No. 15/068,185 by Bernhardt et al., entitled "Conductive Hard Mask For Memory Device Formation," filed Mar. 11, 2016, assigned to the assignee hereof, and is expressly incorporated by reference in its entirety herein.

BACKGROUND

The following relates generally to memory devices and more specifically to using a conductive hard mask during formation of memory devices.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., PCM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Fabricating a memory device may include forming and removing material according to a pattern defined by a sacrificial material. In some cases, the sacrificial material may not be removed completely before the next processing step, which may result in the material being retained in the final memory device. This may result in the failure of memory cells or the memory array itself.

BRIEF DESCRIPTION OF THE DRAWINGS

The disclosure herein refers to and includes the following figures.

DETAILED DESCRIPTION

Figure 1:
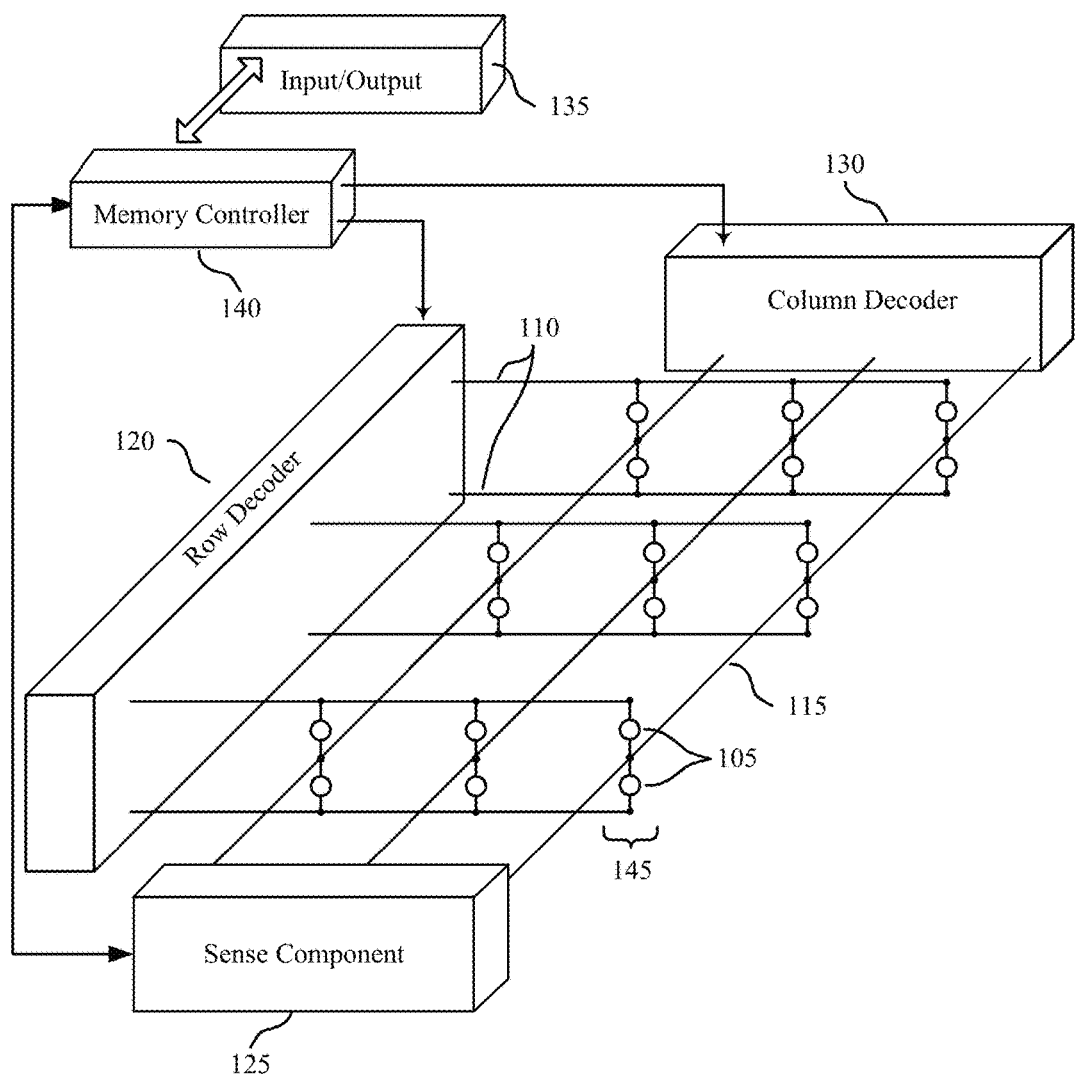
FIG. 1 illustrates an example memory array formed with a conductive hard mask in accordance with various embodiments of the present disclosure.

Electronic devices may be formed or fabricated using sacrificial materials that allow the devices to operate even if some or all of the sacrificial material remains after fabrication. The fabrication of electronic devices typically includes numerous steps of forming and removing material. Various materials may be deposited and then patterned to create the different individual components of a device. For example, a memory cell may include one or more electrodes and a memory element to encode data. In some architectures, creating a memory cell may involve forming layers of material upon one another and removing material according to a predefined pattern. The pattern may be defined in a sacrificial material, such as a mask. The mask material may be resistant to specific material-removing techniques (e.g., etching), thus enabling the selective removal of areas not covered by the mask.

Masks may be described as "hard" or "soft." Soft masks are typically made of polymer materials, while hard masks are typically solid materials. Hard masks may allow for selective removal of certain portions of a device when used with etching techniques, such as plasma etching; that is, the hard mask may resist etching more readily than other materials. So the mask may be patterned on a substrate and subsequent etching may selectively remove areas not covered by the mask.

After etching, the mask may be removed, for example, using a chemical or mechanical process designed to remove the mask material. Etching and other material removal process tend not to be perfectly selective, however; and removing one material may result in unwanted removing of another material. Thus, it may be difficult to precisely remove a mask uniformly and completely without affecting the substrate or component directly underneath the mask. So for a given formation process, there may be competing concerns related to effectively masking desirable material and effectively removing a mask to expose the desirable material.

Removing the hard mask may involve various approaches that are dependent on different process considerations. On the one hand, complete mask removal may be desirable or highly preferable for some processes or at certain stages in a process. For example, after a mask-removal process step, another material may be deposited, patterned, and etched, and any remaining mask material may detrimentally affect that processing step or others that follow. In some cases, an incomplete mask removal may also affect final memory device operation. So a process may be designed to error on the side of over etching (or over polishing) in an effort to completely remove a mask. This type of approach may be employed when collateral etching of material underneath the mask is acceptable.

Alternatively, device operation may be particularly sensitive or subject to tightly controlled tolerances of a material or component underneath a mask. In such cases, a process may be designed to allow some mask to be retained—e.g., the process may error on the side of under etching (or under polishing).

In many situations, however, there is limited or no option to retain portions of a mask if the mask may impact device performance. This may be due in part to the material used for the mask, which may have desirable properties for formation, but which may have undesirable properties for device operation. Additionally, in many cases, operational considerations dictate that material underlying a mask needs to be retained for desirable device operation. In other words, in some scenarios, both over etching and under etching are problematic. But in some cases, concerns about under etching may be mitigated by selecting a hard mask that has characteristics desirable for both formation and operation of a final device.

By way of example, and as mentioned above, a memory cell may include one or more electrodes and a memory element to encode data. These features may be formed using a hard mask. The hard mask may be an electrical insulator, such as silicon nitride (SiN). After removing the hard mask, a conductive material may be deposited to connect the memory cell to various other components used to operate the memory cell. Thus, to provide an electrical connection—i.e., to prevent open circuit conditions or failure points of the memory cell—it may be important to completely remove electrically insulating hard mask material during formation of the device. In some cases, memory cell operation depends largely on the electrode and its configuration. For example, in phase change memory, the memory element is written by heating the electrodes, and variation in the electrodes may affect the ability to set the logic state of the memory element. Thus, the successful formation of a memory cell may depend on hard mask material with limited or no impacts on the electrode underneath the hard mask.

As described herein, an electrically conductive hard mask may be used to define features during device formation. Using an electrically conductive hard mask in addition to or instead of an electrically insulating hard mask may mitigate some of the issues identified above. For instance, an electrically conductive hard mask may be useful in effectively protecting underlying materials during device formation, and the electrically conductive hard mask may be under polished—i.e., it may be partially left behind—without creating an open circuit condition or failure point on a memory cell. As mentioned above, under polishing may help mitigate or avoid degrading the electrode underlying the mask during mask removal.

In some cases, a mask may be removed by chemical-mechanical planarization (CMP), which involves a chemical treatment combined with mechanical polishing. Given a typical silicon wafer size (e.g., tens of centimeters in diameter) and inherent variations in material deposition across such wafers, it may be challenging to remove a hard mask to within nanometer-scale tolerances (e.g., $10^{-7}$ cm) that may be desirable for device formation. By using a conductive hard mask, the CMP window—i.e., the acceptable variation of polishing across the wafer—may be increased. This may relax manufacturing constraints or improve throughput of successfully fabricated devices, or both, and it may therefore reduce production costs.

Features and techniques introduced above are further described below in the context of a memory array. Specific examples are then described for using a conductive hard mask during formation of a memory array. These and other features of the disclosure are further illustrated by and described with reference to apparatus diagrams, system diagrams, and flowcharts. Although embodiments of the disclosure are discussed in reference to a memory array, a conductive hard mask may be used during the formation of other electronic devices or components.

FIG. 1 illustrates an example memory array 100 formed with a conductive hard mask in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may include a material, which may be referred to as a memory element, having a variable and configurable electrical resistance that is representative of the logic states. For example, a material with a crystalline or an amorphous atomic configuration may have different electrical resistances. A voltage applied to the memory cell 105 may thus result in different currents depending on whether the material is in a crystalline or an amorphous state, and the magnitude of the resulting current may be used to determine the logic state stored by memory cell 105. In some cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element. For example, the memory element may be positioned between two electrodes, and the electrodes may increase in temperature when a current flows through them. This heating may be sensitive to the configuration of an electrode in memory cell 105 and any unintentional etching of an electrode during formation may affect negatively memory array 100 performance.

Memory array 100 may be a three-dimensional (3D) memory array, where two-dimensional (2D) memory arrays are formed on top of one another. This may increase the number of memory cells that may be placed or created on a single die or substrate as compared with 2D arrays, which in turn may reduce production costs or increase the performance of the memory array, or both. According to the example depicted in FIG. 1, Memory array 100 includes two levels of memory cells 105 and thus may be considered a three-dimensional memory array; however, the number of levels is not limited to two. Each level may be aligned or positioned so that memory cells 105 may be approximately aligned with one another across each level, forming a memory cell stack 145. Variations in hard mask removal may detrimentally affect subsequent layers in the 3D array. For example, if the hard mask is not completely removed in some areas, subsequent material deposition may be non-uniform across the layer. So areas where hard mask was not removed may be elevated with respect to neighboring areas. This may be compounded over multiple levels in the 3D array, leading to deformities in the final array.

Each row of memory cells 105 is connected to a word line 110, and each column of memory cells 105 is connected to a bit line 115. Word lines 110 and bit lines 115 may also be known as access lines and in some cases, a bit line 115 may be referred to as a digit line. References to word lines and bit lines, or their analogues, are interchangeable without loss of understanding or operation. Word lines 110 and bit lines 115 may be substantially perpendicular to one another to create an array. As shown in FIG. 1, the two memory cells 105 in a memory stack 145 may share a common access line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of a word line 110 and a bit line 115. This intersection may be referred to as a memory cell's address.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100. In some cases, a remaining portion of an electrically conducting hard mask may be between a memory cell 105 and a word line 110 or a bit line 115.

Operations such as reading and writing may be performed on memory cells 105 by activating or selecting a word line 110 and bit line 115. Activating or selecting a word line 110 or a bit line 115 may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon (C), conductively-doped semiconductors, or other conductive materials, alloys, or compounds. Upon selecting a memory cell 105, the resulting signal may be used to determine the stored logic state. For example, a voltage may be applied and the resulting current may be used to differentiate between the resistive states of the phase change material.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or sense component 125 may connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input 135, to be written to the memory cells 105. In the case of phase change memory, a memory cell 105 is written by heating the memory element, for example, by passing a current through the memory element. This process is discussed in more detail below In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM cells may have beneficial properties that may result in improved performance relative to other memory architectures. For example, PCM may offer comparable read/write speeds as DRAM but may be non-volatile and may allow for increased cell density using 3D architectures.

The memory controller 140 may control the operation (read, write, re-write, refresh, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
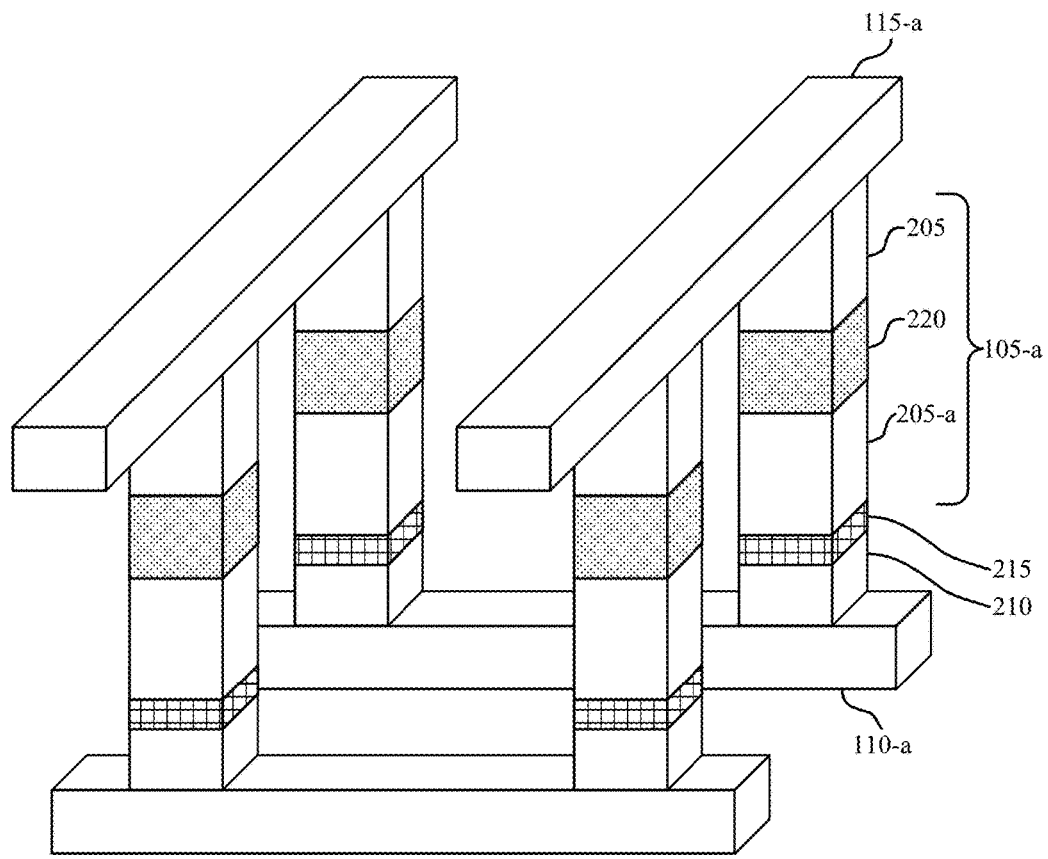
FIG. 2 illustrates an example memory array formed with a conductive hard mask in accordance with various embodiments of the present disclosure.

FIG. 2 illustrates an example memory array 200 that supports formed with a conductive hard mask in accordance with various embodiments of the present disclosure. Memory array 200 may be an example of memory array 100 with reference to FIG. 1. Memory array 200 includes memory cells 105-a, word lines 110-a, and bit lines 115-a, which may be examples of a memory cell 105, word line 110, and bit line 115, as described with reference to FIG. 1. Memory cell 105-*a* includes electrode 205, electrode 205-*a*, and memory element 220. Memory array 200 also includes bottom electrode 210 and selection component 215. The formation process of memory array 200 includes the use a conductive hard mask to define at least some of the components of memory array 200, for example, the pillar structure.

A 3D memory array may be created by forming multiple memory arrays 200 on one another. In some cases, the two stacked arrays may have common access lines such that each level may share word lines 110 or bit lines 115 as described with reference to FIG. 1. As the array is formed, it may be important to remove sacrificial material used in the formation of each individual level to prevent misalignment within the following levels. For example, if hard mask material is retained on electrode 205, material deposited subsequently may be displaced in the vertical direction relative to other areas.

Although not shown in FIG. 2, electrically insulating regions or layers may be formed or deposited around the component of memory array 200. The electrically insulating regions may include oxide or nitride materials, such as silicon oxide, silicon nitride, or other electrically insulating materials.

As described above, various logic states may be stored by programming the electrical resistance of memory element 220. In some cases, this may include passing a current through memory cell 105-*a*, heating memory cell 105-*a*, or melting the memory element 220 wholly or partially. Memory element 220 may be a material with a variable resistance. Variable resistance materials may refer to various material systems, including, for example, metal oxides, and chalcogenides, among others. Chalcogenide materials are materials or alloys that include at least one of the elements sulfur (S), selenium (Se), or tellurium (Te). Many chalcogenide alloys may be possible and some are referred to herein—for example, a germanium (Ge)-antimony (Sb)-tellurium alloy (Ge—Sb—Te) is a chalcogenide material. Other chalcogenide alloys not expressly recited here may also be employed. Although the present disclosure is discussed in relation to PCM, a conductive hard mask may be used to form components of any memory or electronic device.

PCM exploits the large resistance contrast between crystalline and amorphous states in phase change materials, which may be chalcogenide materials. A material in a crystalline state may have atoms arranged in a periodic structure, which may result in a relatively low electrical resistance. By contrast, material in an amorphous state may have no or relatively little periodic atomic structure, which may have a relatively high electrical resistance. The difference in resistance values between amorphous and crystalline states of a material may be significant; for example, a material in an amorphous state may have a resistance one or more orders of magnitude greater than the resistance of the material in its crystalline state. In some cases, the material may be partially amorphous and partially crystalline, and the resistance may be of some value between the resistances of the material in a wholly crystalline or wholly amorphous state. So a material may be used for other than binary logic applications—i.e., the number of possible states stored in a material may be more than two.

To set a low-resistance state, a memory cell 105-*a* may be heated by passing a current through the memory cell. Heating caused by electrical current flowing through a material that has a finite resistance may be referred to as Joule or ohmic heating. Joule heating may thus be related to the electrical resistance of electrodes or phase change material. Heating the phase change material to an elevated temperature (but below its melting temperature) and then cooling over a finite time period may result in the phase change material crystallizing and forming the low-resistance state. In some cases, a memory cell 105-*a* may be heated by means other than Joule heating, for example, by using a laser.

To set a high-resistance state, the phase change material may be heated above its melting temperature, for example, by Joule heating. The amorphous structure of the molten material may be quenched, or locked in, by abruptly removing the applied current to quickly cool the phase change material. The process of heating memory cell 105-*a* may be dependent on electrodes 205 and 205-*a*. For example, the electrical resistance of each electrode may be important to achieve the correct temperature profile across memory cell 105-*a* to effectively program it. Thus, it may be important that electrodes 205 and 205-*a* are not affected during the removal of hard mask. For example, over polishing to fully remove the hard mask during processing may physically alter an electrode 205 underlying the hard mask and may thus compromise the resistivity of the electrode 205.

Selection component 215 may, in some cases, be connected in series between a memory cell 105-*a* and at least one conducive line such as a word line 110-*a* or a bit line 115-*a*. The selection component may aid in selecting a particular memory cell 105-*a* or may help prevent stray currents from flowing through non-selected memory cells 105-*a* adjacent a selected memory cell 105-*a*. As depicted in FIG. 2, selection component 215 may be located between electrode 205-*a* and bottom electrode 210; thus, selection component 215 may be located in series between memory cell 105-*a* and word line 110-*a*. Other configurations are possible. For example, selection component 215 may be located in series between memory cell 105-*a* and bit line 115-*a*. The selection component may include an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, the selection component is a chalcogenide film. The selection component may, in some examples, be an alloy of Se, Ge, and arsenic (As).

Memory array 200 may be formed using various combinations of deposition and removal. For example, layers of material corresponding to the word line 110-*a*, bottom electrode 210, selection component 215, electrode 205-*a*, memory element 220, and electrode 205 may be deposited. Various techniques may be used to form materials or components of memory array 200. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques.

Material may be selectively removed to create the desired features, such as the pillar structure depicted in FIG. 2. For example, a hard mask may be deposited and patterned. As mentioned above, hard masks are materials that are resistant to various forms of material-removing techniques, such as etching. Thus, the hard mask may be patterned on a substrate and subsequent etching may selectively remove areas not covered by the hard mask.

The hard mask may be patterned using photolithography and etching. For example, a photoresist material may be applied to the hard mask layer and an etching pattern may be defined through photolithography. An etching step may be performed to etch the hard mask material and form the patterned hard mask. A second material removal step may then be performed to remove material according the patterned hard mask. In some cases, the second etch step may use plasma etching (also referred to as "dry etching") because the hard mask may be resistive to dry etching. Other material removal techniques include chemical etching (also referred to as "wet etching") or chemical-mechanical planarization (CMP).

After a desired structure has been formed, the hard mask may be removed, for example, by CMP. In some cases, it may be helpful to remove the entire hard mask while maximizing the thickness of electrode 205, i.e., to neither over polish or under polish while removing the mask. Some masks may be electrically insulating materials, for example, silicon nitride (SiN). If any residual insulating hard mask remains, memory cell 105-a may fail because an electrical connection may not be formed between electrode 205 and bit line 115-a, which may result in an open circuit condition within memory cell 105-a referred to as an "open fail."

To ensure the mask is removed completely, the mask removal may involve over etching or over polishing. For example, a CMP process may be used to remove the hard mask. Some local areas may be over polished; that is, the CMP process may remove material from electrode 205 in an effort to ensure that hard mask material is removed across the substrate. Over polishing, however, may create other problems during processing. For example, it may lead to seal or fill dishing, where material between memory cells 105-a, such as insulating material) is removed at a faster rate than the hard mask material, forming recessed areas in the material between memory cells 105-a. This effect may be referred to as "dishing". Dishing may affect subsequent deposition, including, for example, layers deposited and etched to form bit lines 115-a. When a layer is deposited on dished material, voids may form in the layer, which may result in electrical or structural deficiencies in a bit line 115-a. Dishing may also reduce the etch margin when forming bit line 115-a; for example, memory element 220 may be shorted to bit line 115-a if the dishing is deep enough.

Thus, as disclosed herein, an electrically conductive hard mask may be used to form memory array 200. Because it is conductive, the mask may be under polished, i.e., may be left behind, without causing an open fail of a memory cell. That is, hard mask material may remain between bit line 115-a and electrode 205 without causing an open fail. Under polishing may also help prevent modification of electrode 205 by the mask removal process. In some cases, the mask may be removed by CMP, and the CMP process may be designed for under polishing.

FIGS. 3A-3G illustrate an example process flow for forming a memory cell array using a conductive hard mask in accordance with various embodiments of the current disclosure. The process flow includes processing steps 300, 301, 302, 303, 304, 305, and 306. The resulting memory array may be an example of memory array 100 or 200 described with reference to FIGS. 1 and 2. Processing steps 300-306 include formation of electrode layers 320, memory element layer 325, selection component layer 330, word line layer 335, and bit line layer 355, which may, after processing, be examples of electrodes 205 and 210, memory elements 220, selection component 215, word lines 110, and bit lines 115 described with reference to FIGS. 1 and 2. Memory element 220 layer may, for example, be a variable resistance material, a chalcogenide, or a phase change material. Processing steps 300-306 also include formation of hard mask layer 315, additional hard mask layer 310, interconnect 340, insulator 345, sealant 350, and via 365.

At processing step 300, a stack of layers is formed, for example, by depositing the various layers shown on substrate 360. Substrate 360 may be a pristine substrate or may be the result of previous processing steps, for example, previous processing steps associated with previously formed memory arrays. Processing step 300 may include forming a word line layer 335, forming electrode layer 320-c, forming a selection component layer 330, forming electrode layer 320-b, forming a memory element layer 325, forming electrode layer 320-a, and forming a hard mask layer 315. Thus, processing step 300 may include forming a memory element layer 325 comprising a variable resistance material, forming a conductive layer on the memory element layer, for example, an electrode layer 320-a, and forming a hard mask layer 315 on the conductive layer.

Electrode layers 320-a, 320-b, and 320-c may, in some examples, be carbon, tungsten, aluminum, titanium, titanium nitride, silicon, or any combination thereof. In general, each electrode layer 320 (320-a, 320-b, 320-c) may be a different material. Hard mask layer 315 may be a conductive material as well, such as W, Al, Ti, titanium nitride (TiN), silicon (Si), or any combination thereof. For example, compounds including W—Si—N, Si—N, Ti—N, (where N is nitrogen), or other materials may be possible. In some examples, hard mask layer 315 may be a different material than electrode layer 320-a. In other examples, hard mask layer 315 may include a set of sublayers, where each sublayer of the set comprises a different conductive material.

Processing step 300 may also include forming a second hard mask, additional hard mask layer 310, on top of hard mask layer 315. Additional hard mask layer 310 may, in some instances, be an electrically insulating material, such as SiN. In some cases, it may be TiN.

Figure 3A:
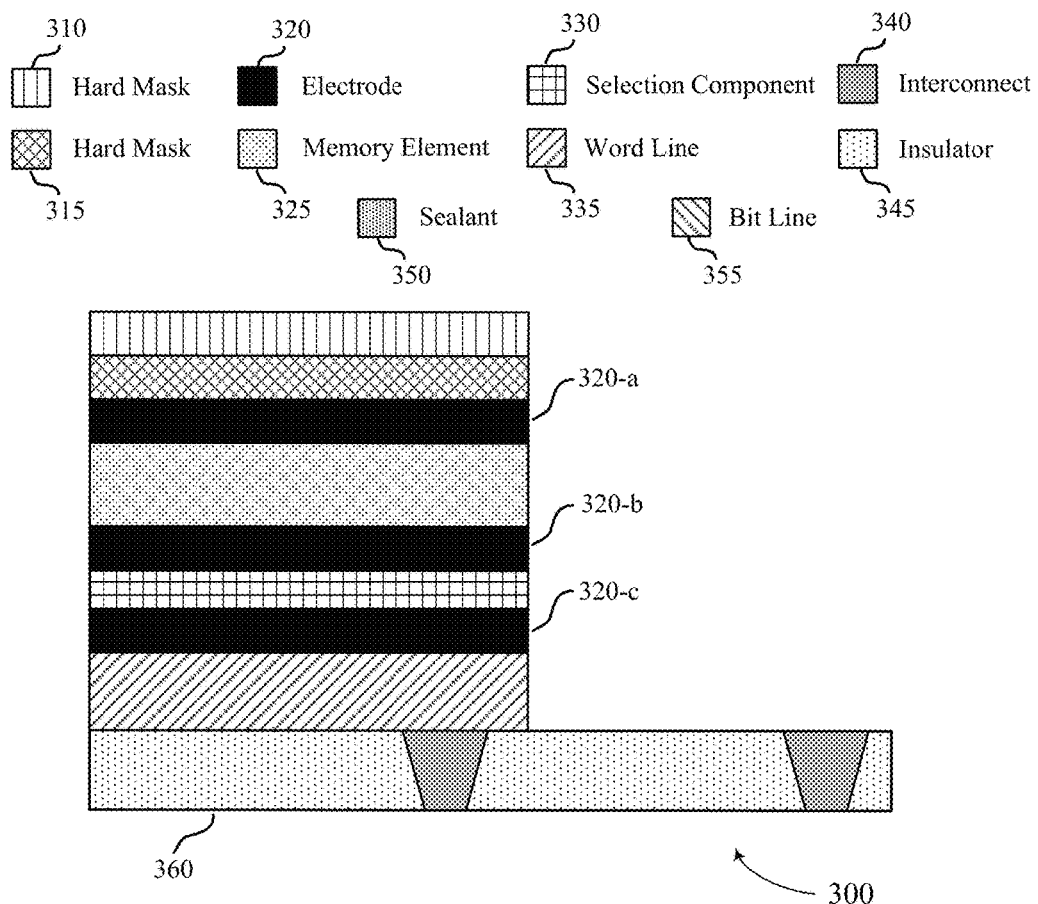
FIGS. 3A-3G illustrate exemplary steps in a process flow for forming a memory array using a conductive hard mask in accordance with various embodiments of the present disclosure.
Figure 3B:
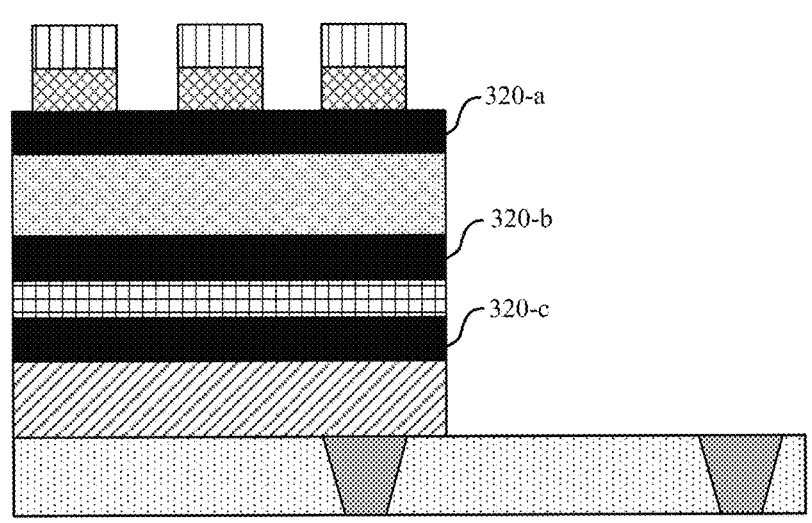

At processing step 301, shown in FIG. 3B, a pattern is formed in hard mask layer 315. If both hard mask layer 315 and additional hard mask layer 310 are present, the pattern may be formed in both hard masks. In other cases, the pattern may be formed only in additional hard mask layer 310. In some instances, the pattern may be formed using photolithography and etching (e.g., dry etching). In some examples, the pattern may be formed using pitch multiplication, where two or more photolithography and etching steps are combined to decrease the pitch, or distance, between features.

Figure 3C:
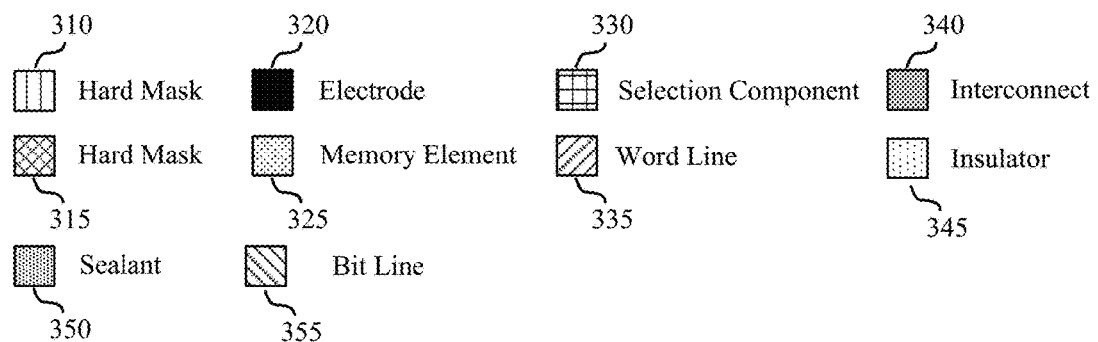
Figure 3C:
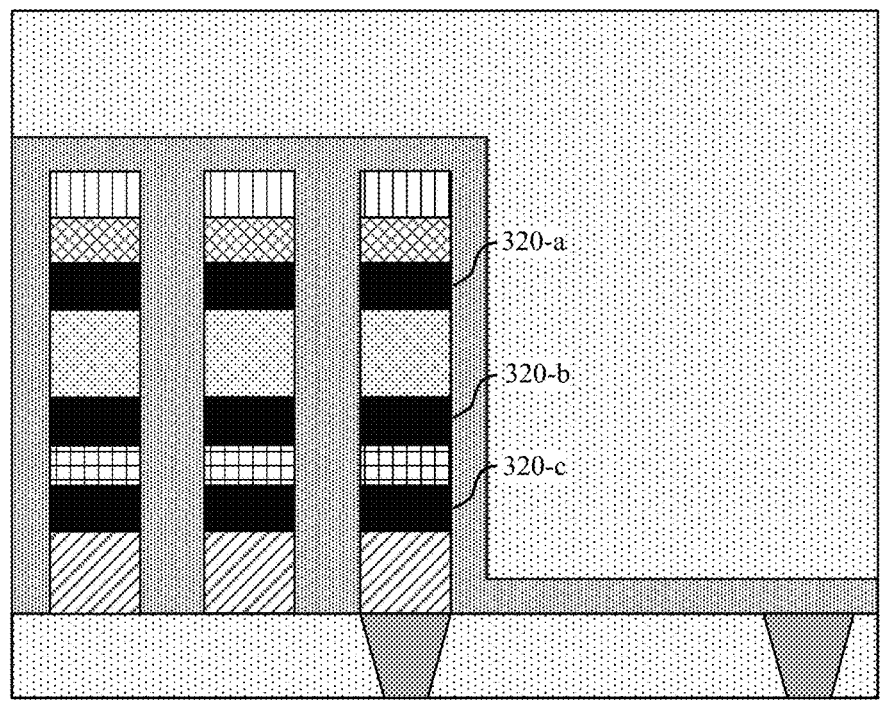

At processing step 302, shown in FIG. 3C, material is removed to form features according to the patterned hard mask layer 315, for example, the channels shown in FIG. 3C. Thus, processing step 302 may include removing a first portion of the conductive layer, e.g., electrode layer 320-a, and a first portion of memory element layer 325 and retaining a second portion of the conductive layer, electrode layer 320-a, and a second portion the memory element layer 325 under the pattern of the conductive hard mask layer 315. In some cases, further material may be removed, including memory element layer 325, electrode layer 320-b, selection component layer 330, electrode layer 320-c, and word line layer 335 according to the patterned hard mask layer 315, and may be performed in the same material removal step or in additional material removal steps. The material may be removed by one or various etching techniques, including dry etching.

After removing material, processing step 302 may include forming regions of sealant 350 or insulator 345. These materials may be electrically insulating and may provide support for the components formed during etching. In some cases, sealant 350 may be deposited before insulator 345. In some examples, sealant 350 may be the same material as insulator 345, and may be silicon oxide.

Figure 3D:
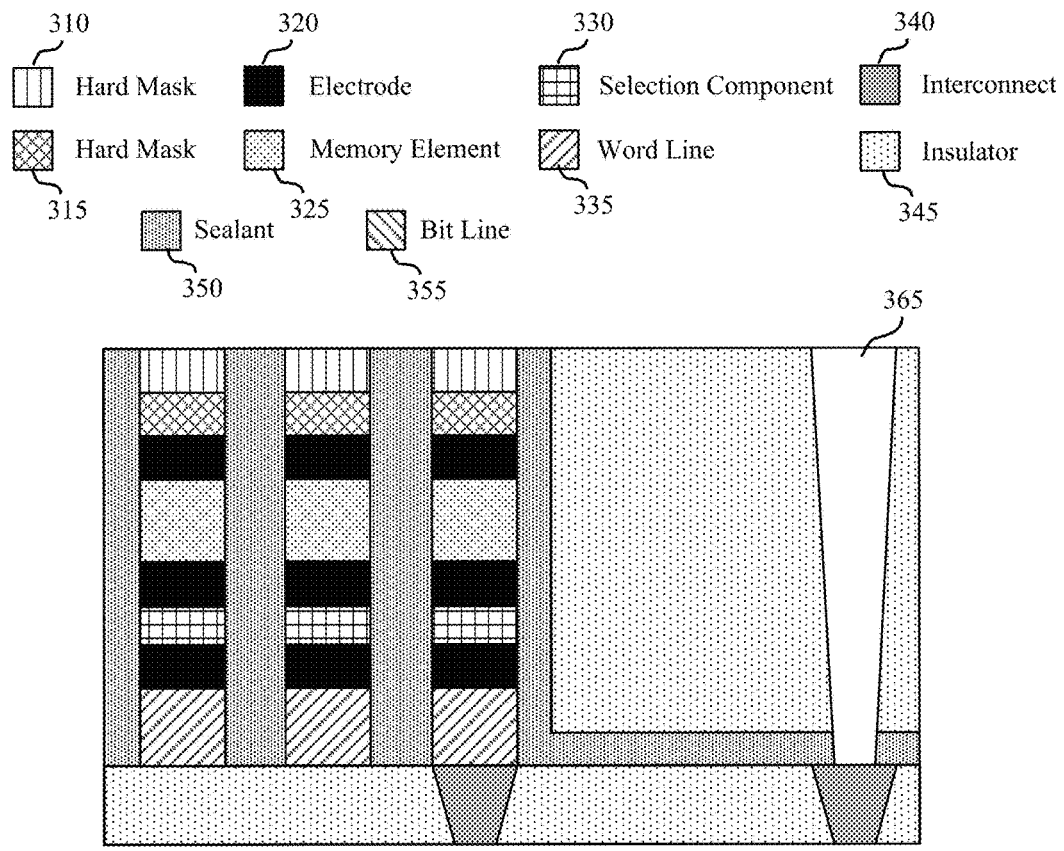

At processing step 303, shown in FIG. 3D, material may be removed in order to create a flat interface at the top of the stack. For example, depositing insulator 345 and sealant 350 in processing step 302 may result in various non-uniformities in thickness across the memory array. Removing material in processing step 303 may planarize the stack by removing material to the top of additional hard mask layer 310. In some cases, material may be removed using CMP.

In some examples, via 365 may be formed after planarizing. Via 365 may be located over an interconnect 340 in order to electrically connect to other layers below. Via 365 may be formed by removing material, for example, through etching, and may involve a photolithography step to define the location and dimensions of via 365.

Figure 3E:
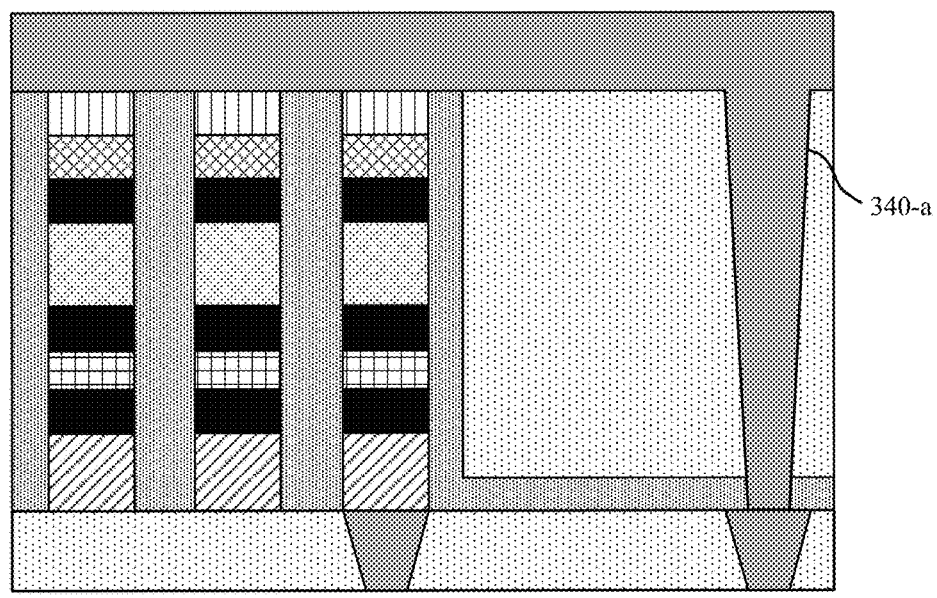
Figure 3F:
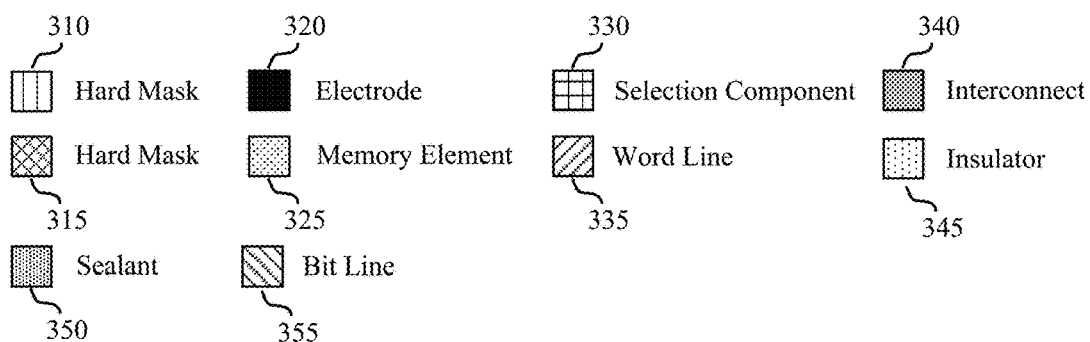
Figure 3F:
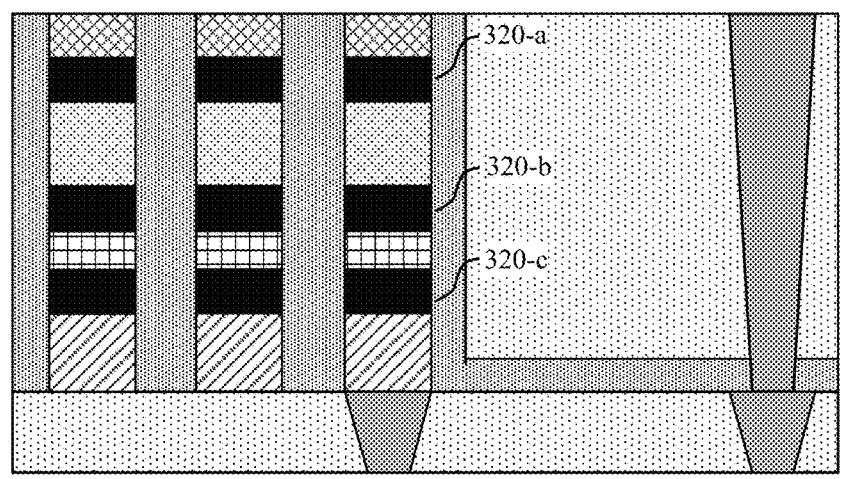

At processing step 304, shown in FIG. 3E, material may be deposited in order to form interconnect 340-a. For example, a conductive material may be deposited to fill via 365.

At processing step 305, shown in FIG. 3F, material may again be removed. For example, the stack may be planarized following material deposition in processing step 304. Processing step 305 may include removing additional hard mask layer 310. A portion of hard mask layer 315 may also be removed. In some cases, this may expose electrode layer 320-a if the entirety of hard mask layer 315 is removed. In other cases, a finite thickness of hard mask layer 315 may be retained. Thus, some or all of electrode layer 320-a in FIG. 3F may have remnants of hard mask layer 315 after processing step 305. In some instances, the patterned hard mask layers 315 and 310 may be removed using a chemical-mechanical planarization (CMP) process.

Figure 3G:
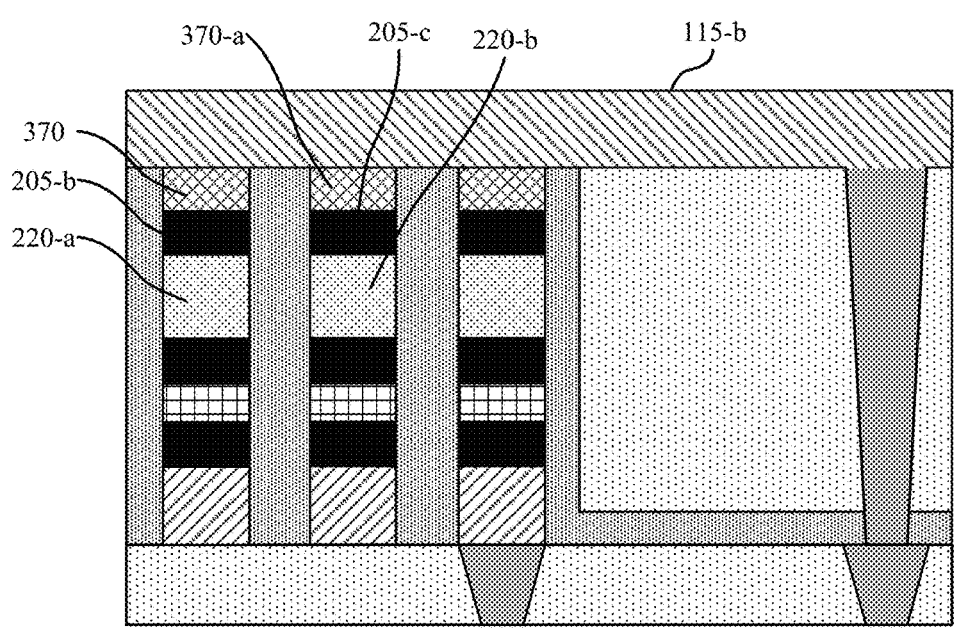

At processing step 306, shown in FIG. 3G, bit line layer 355 may be deposited to form conductive lines, such as bit lines 115. For example, bit line layer 355 may be deposited, and a pattern may be created, for example, through photolithography and etching. This pattern and subsequent material removal may form channels substantially perpendicular to those shown in FIG. 3G, thus resulting in the pillar structure shown in FIG. 2. Thus, performing processing steps 300-306 may be employed to form a memory array.

The resulting array shown in FIG. 3G includes memory elements 220-a and 220-b, electrodes 205-b and 205-c, and bit line 115-b, which may be examples of a memory element 220, electrode 205 and a bit line 115 described with reference to FIGS. 1 and 2. After processing step 306, conductive hard mask 370 and 370-a may be present. Thus, the memory array may have a first memory element 220-a comprising a variable resistance material, a first electrode 205-b coupled to the memory element 220-a, and at least a portion of conductive hard mask 370 coupled to electrode 205-b. A conductive line, such as bit line 115-b, may be coupled to the first electrode 205-b via the conductive hard mask 370, where the conductive hard mask 370 comprises a portion having a first thickness.

The memory array may also include a second memory element 220-b comprising the variable resistance material, and a second electrode 205-c coupled to the second memory element 220-b. The conductive line, bit line 115-b, may be coupled to the second electrode 205-c via the conductive hard mask 370-a. In some cases, conductive hard mask 370-a comprises a portion having a second thickness different from the first thickness of hard mask 370. In other examples, conductive hard mask 370 may be present but conductive hard mask 370-a may not be—i.e., in some examples, hard mask 370-a is completely removed in processing step 305—and the conductive line, bit line 115-b, may be coupled to conductive mask 370 and electrode 205-c. In other examples, both conductive hard masks 370 and 370-a may be completely removed, and the conductive line, bit line 115-b, may be coupled directly to first and second electrodes 205-b and 205-c.

Figure 4:
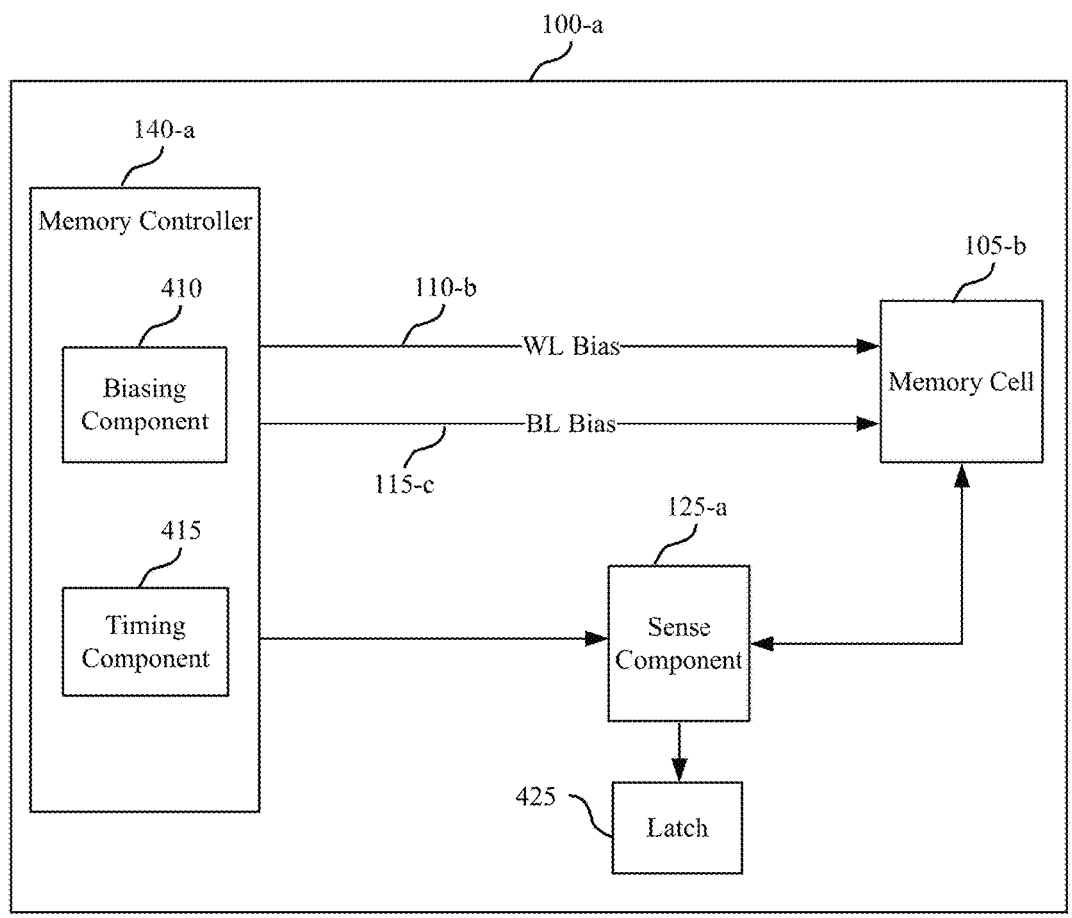
FIG. 4 illustrates a memory array formed with a conductive hard mask in accordance with various embodiments of the present disclosure.

FIG. 4 shows a block diagram 400 of a memory array 100-a formed with a conductive hard mask in accordance with various embodiments of the present disclosure. Memory array 100-a may be referred to as an electronic memory apparatus and may include memory controller 140-a and memory cell 105-b, which may be examples of memory controller 140 and memory cell 105 described with reference to FIGS. 1 and 2. Memory controller 140-a includes biasing component 410 and timing component 415 and may operate memory array 100-a as described in FIGS. 1 and 2. Memory controller 140-a may be in electronic communication with word line 110-b, bit line 115-c, and sense component 125-a, which may be examples of word line 110, bit line 115, and sense component 125, described with reference to FIGS. 1-3. Memory array 100-a may also include latch 425. The components of memory array 100-a may be in electronic communication with one another and may perform the functions described with reference to FIGS. 1 and 2. In some cases, sense component 125-a and latch 425 may be components of memory controller 140-a.

Memory controller 140-a may be configured to activate word line 110-b or bit line 115-c by applying voltages or currents to those various nodes. For example, biasing component 410 may be configured to apply a voltage to operate memory cell 105-b to read or write memory cell 105-b as described above. The applied voltage may be based on a desired current to be applied as well as the resistance of memory cell 105-b and any electrodes. In some cases, conductive hard mask left over from processing may be positioned in series between memory cell 105-b and word line 110-b or bit line 115-c. Memory controller 140-a may include a row decoder, column decoder, or both, as described with reference to FIG. 1. This may enable memory controller 140-a to access one or more memory cells 105-b. Biasing component 410 may also provide voltages to operate sense component 125-a.

In some cases, memory controller 140-a may perform its operations using timing component 415. For example, timing component 415 may control the timing of the various word line or bit line selections, including timing for switching and voltage application to perform the memory functions, such as reading and writing, discussed herein. In some cases, timing component 415 may control the operations of biasing component 410.

Sense component 125-a may include voltage or current sense amplifiers to determine the stored logic state in memory cell 105-b. Upon determining the logic state, sense component 125-a may then store the output in latch 425, where it may be used in accordance with the operations of an electronic device using memory array 100-a.

Figure 5:
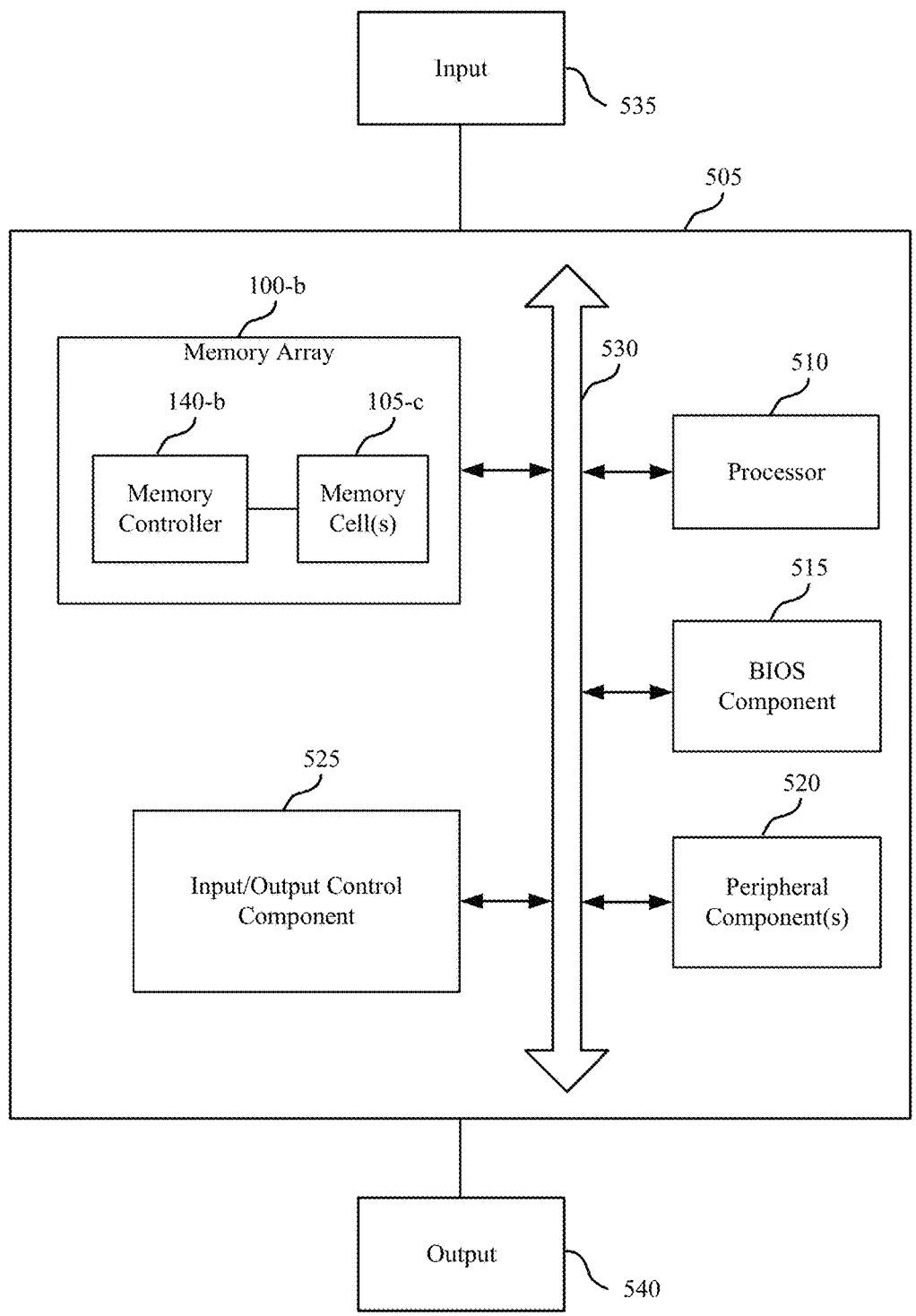
FIG. 5 illustrates a system, including a memory array formed with a conductive hard mark, in accordance with various embodiments of the present disclosure.

FIG. 5 shows a diagram of a system 500 that includes a memory array formed with a conductive hard mask in accordance with various embodiments of the present disclosure. System 500 may include a device 505, which may be or include a printed circuit board to connect or physically support various components. Device 505 may include a memory array 100-*b*, which may be an example of memory array 100 or 200 described in FIGS. 1, 2, and 4. Memory array 100-*b* may contain memory controller 140-*b* and memory cell(s) 105-*c*, which may be examples of memory controller 140 described with reference to FIGS. 1 and 4 and memory cells 105 described with reference to FIGS. 1, 2, and 4. Device 505 may also include a processor 510, BIOS component 515, peripheral component(s) 520, and input/output control component 525. The components of device 505 may be in electronic communication with one another through bus 530.

Processor 510 may be configured to operate memory array 100-*b* through memory controller 140-*b*. In some cases, processor 510 performs the functions of memory controller 140 described with reference to FIGS. 1 and 4. In other cases, memory controller 140-*b* may be integrated into processor 510. Processor 510 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 510 may perform various functions described herein. Processor 510 may, for example, be configured to execute computer-readable instructions stored in memory array 100-*b* to cause device 505 perform various functions or tasks.

BIOS component 515 may be a software component that includes a basic input/output system (BIOS) operated as firmware, which may initialize and run various hardware components of system 500. BIOS component 515 may also manage data flow between processor 510 and the various components, e.g., peripheral components 520, input/output controller component 525, etc. BIOS component 515 may include a program or software stored in read-only memory (ROM), flash memory, or any other non-volatile memory.

Peripheral component(s) 520 may be any input or output device, or an interface for such devices, that is integrated into device 505. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output controller component 525 may manage data communication between processor 510 and peripheral component(s) 520, input devices 535, or output devices 540. Input/output controller component 525 may also manage peripherals not integrated into device 505. In some cases, input/output controller component 525 may represent a physical connection or port to the external peripheral.

Input 535 may represent a device or signal external to device 505 that provides input to device 505 or its components. This may include a user interface or interface with or between other devices. In some cases, input 535 may be a peripheral that interfaces with device 505 via peripheral component(s) 520 or may be managed by input/output controller component 525.

Output 540 may represent a device or signal external to device 505 configured to receive output from device 505 or any of its components. Examples of output 540 may include signals or data sent to a display, audio speakers, a printing device, another processor or printed circuit board, etc. In some cases, output 540 may be a peripheral that interfaces with device 505 via peripheral component(s) 520 or may be managed by input/output controller component 525.

The components of memory controller 140-*b*, device 505, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 6:
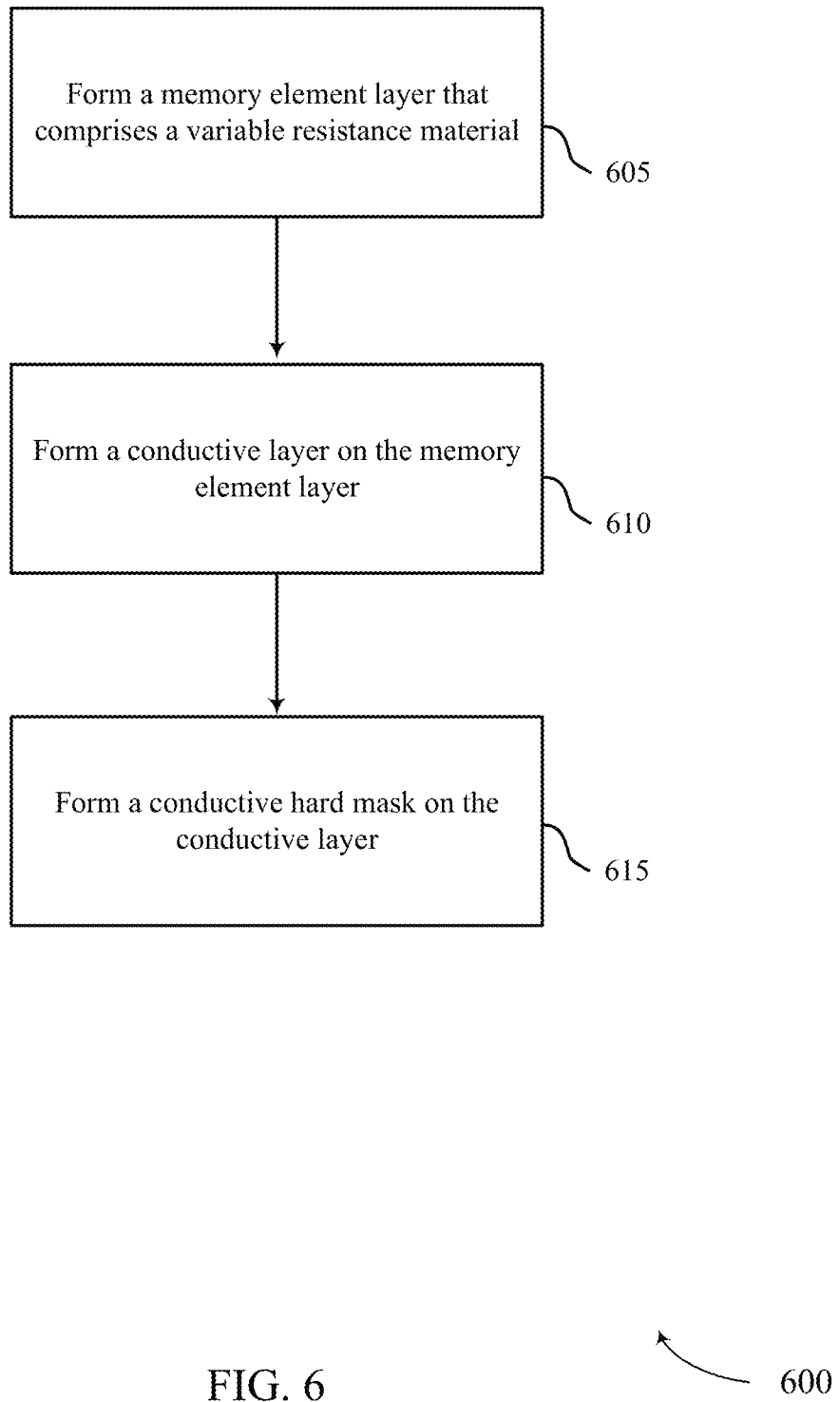
FIGS. 6 and 7 are flowcharts that illustrate a method or methods for forming a memory array using a conductive hard mask in accordance with various embodiments of the present disclosure.

FIG. 6 shows a flowchart illustrating a method 600 of forming a memory array using a conductive hard mask for chemical-mechanical planarization improvements in accordance with various embodiments of the present disclosure. The formation methods may include those describe with reference to FIGS. 2 and 3. For example, materials or components may be formed through various combinations of material deposition and removal. In some cases, material formation or removal may include one or more photolithography steps not recited or described explicitly but understood by those skilled in the art.

At block 605, the method may include forming a memory element layer that comprises a variable resistance material, as described with reference to FIG. 3. In some cases, the variable resistance material is a chalcogenide material or a phase change material.

At block 610, the method may include forming a conductive layer on the memory element layer, as described with reference to FIG. 3. In some examples, the conductive layer may be carbon, tungsten, aluminum, titanium, titanium nitride, silicon, or any combination thereof.

At block 615, the method may include forming a conductive hard mask on the conductive layer, as described with reference to FIG. 3. In some examples, the conductive hard mask may be a material that includes at least one of tungsten, aluminum, titanium, titanium nitride, silicon, or any combination thereof. In some cases, the conductive hard mask material may be different from the conductive layer material.

The method may also include forming an additional hard mask on the conductive hard mask, where, in some cases, the additional hard mask is an electrically insulating material. The method may also include forming a pattern in the conductive hard mask or, if the additional hard mask is present, forming a pattern in the conductive hard mask and the additional hard mask. In some cases, the pattern formed in each hard mask may be the same, and may be formed using photolithography, including by pitch multiplication, and etching, such as dry etching.

The method may also include removing a first portion of the conductive layer and a first portion of the memory element layer, and retaining a second portion of the conductive layer and a second portion the memory element layer under the pattern of the conductive hard mask, i.e., etching according to the patterned hard mask. A portion of the patterned conductive hard mask may then be removed, for example, using a CMP process. By using a conductive hard mask, the CMP margin may be increased because leaving some conductive hard mask behind will not necessarily result in an open fail of the memory cell. In some cases, the removing may expose at least some of the second portion of the conductive layer and a conductive line may be formed on the second portion of the conductive layer. In other cases, the removing may retain a portion of the conductive hard mask, and a conductive line may be formed on the retained portion of the conductive hard mask. In some cases, the conductive hard mask material and the conductive line material may be the same.

Figure 7:
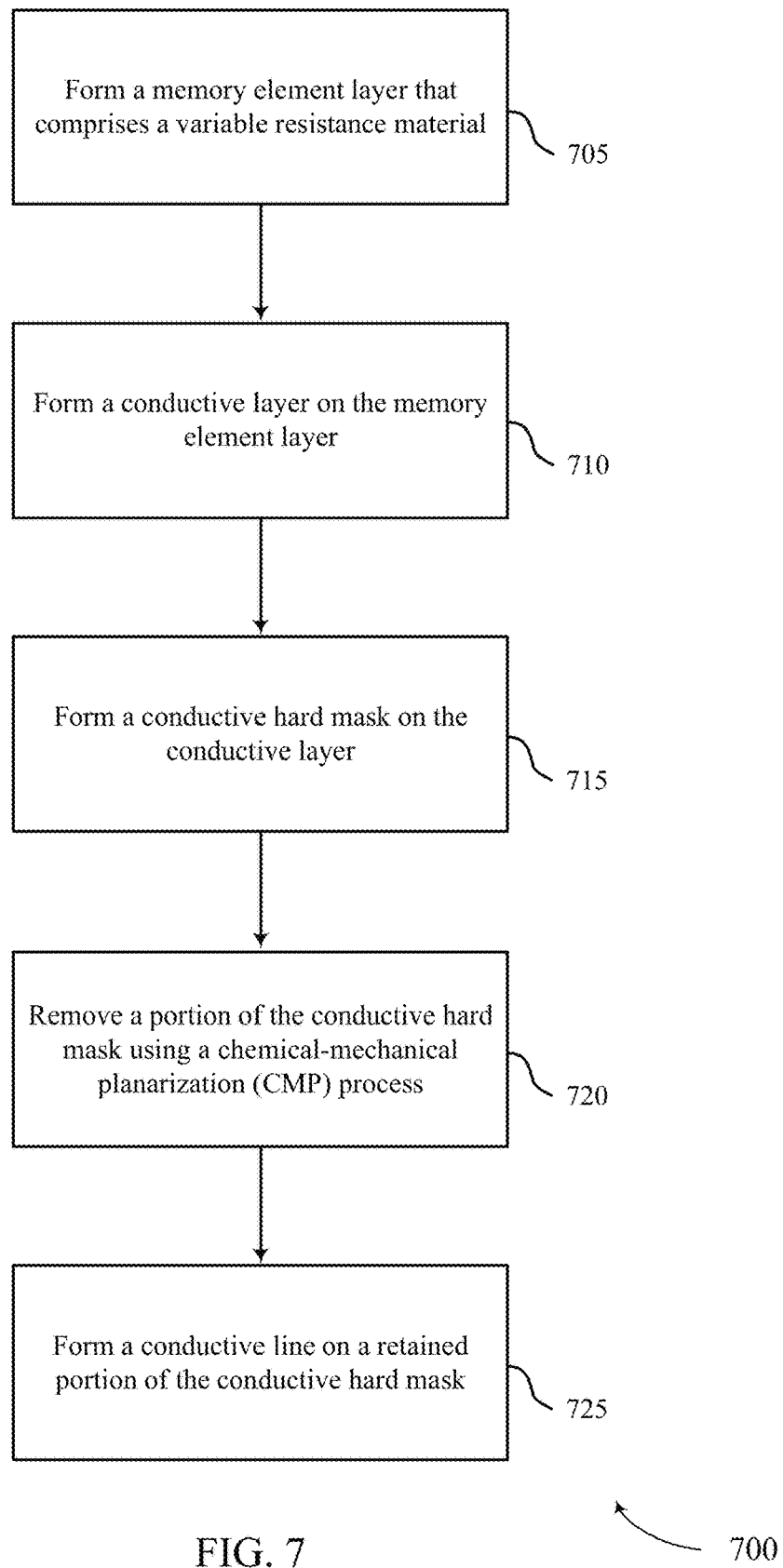

FIG. 7 shows a flowchart illustrating a method 700 of forming a memory array using a conductive hard mask for chemical-mechanical planarization improvements in accordance with various embodiments of the present disclosure. The formation methods may include those describe with reference to FIGS. 2 and 3. For example, materials or components may be formed through various combinations of material deposition and removal. In some cases, material formation or removal may include one or more photolithography steps not recited or described explicitly but understood by those skilled in the art.

At block 705, the method may include forming a memory element layer that comprises a variable resistance material, as described with reference to FIG. 3.

At block 710, the method may include forming a conductive layer on the memory element layer, as described with reference to FIG. 3. In some examples, the conductive layer may be C, W, Al, Ti, TiN, Si, or any combination thereof.

At block 715, the method may include forming a conductive hard mask on the conductive layer, as described with reference to FIG. 3. In some examples, the conductive hard mask may be a material that includes at least one of tungsten, aluminum, titanium, titanium nitride, silicon, or any combination thereof. In some cases, the conductive hard mask material may be different from the conductive layer material.

At block 720, the method may include removing a portion of the conductive hard mask using a chemical-mechanical planarization (CMP) process, as described with reference to FIG. 3. In some cases, the removing may expose at least some of the second portion of the conductive layer and a conductive line may be formed on the second portion of the conductive layer. In other cases, the removing may retain a portion of the conductive hard mask, and a conductive line may be formed on the retained portion of the conductive hard mask. By using a conductive hard mask, the CMP margin may be increased since leaving some conductive hard mask behind will not result in an open fail of the memory cell.

At block 725, the method may include forming a conductive line on a retained portion of the conductive hard mask, as described with reference to FIG. 3. In some cases, the conductive hard mask material and the conductive line material may be the same.

The method may also include forming an additional hard mask on the conductive hard mask, where, in some cases, the additional hard mask is an electrically insulating material. The method may also include forming a pattern in the conductive hard mask or, if the additional hard mask is present, forming a pattern in the conductive hard mask and the additional hard mask. In some cases, the pattern formed in each hard mask may be the same, and may be formed using photolithography. The method may also include removing a first portion of the conductive layer and a first portion of the memory element layer, and retaining a second portion of the conductive layer and a second portion the memory element layer under the pattern of the conductive hard mask, i.e., etching according to the patterned hard mask.

Thus, methods 600 and 700 may be methods of forming a memory array using a conductive hard mask for chemical-mechanical planarization improvements. It should be noted that methods 600 and 700 describe possible implementations, and the operations and steps may be rearranged or otherwise modified such that other implementations are possible. In some examples, features from two or more of the methods 600 and 700 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, "coupled to" indicates components that are substantially in contact with one another. In some cases, two components may be coupled even if a third material or component physically separates them. In some cases, this third component may not substantially alter the two components or their functions. Instead, this third component may aid or enable the connection of the first two components. For example, some materials may not strongly adhere when deposited on a substrate material. Thin (e.g., on the order of a few nanometers or less) layers, such as lamina layers, may be used between two materials to enhance their formation or connection. In other cases, a third material may act as a buffer to chemically isolate two components.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than the third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation.

For example, a photoresist material may be formed on a base material by, for example, spin-coating the photoresist material on the base material. A pattern may be created in the photoresist by exposing the photoresist to radiation. The pattern may be defined by a photo mask, for example, where the photo masks spatially delineates where the radiation exposes the photoresist. Exposed photoresist areas may then be removed, for example, by chemical treatment. In some cases, the exposed regions may remain and the unexposed regions may be removed.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including memory array 100, may be formed on a semiconductor substrate, such as Si, Ge, silicon-germanium alloy, gallium arsenide (GaAs), gallium nitride (GaN), etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. A portion or cut of a substrate contain a memory array or circuit may be referred to as a die.

Chalcogenide materials may be materials or alloys that include at least one of the elements S, Se, Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A memory cell apparatus, comprising:
   a first memory element that comprises a variable resistance material;
   a first electrode coupled with the first memory element;
   at least a portion of a conductive hard mask coupled with the first electrode;
   a conductive line coupled with the first electrode via the conductive hard mask, wherein the conductive hard mask comprises a portion having a first thickness; and
   a second memory element that comprises the variable resistance material; and
   a second electrode coupled with the second memory element, wherein the conductive line is coupled with the second electrode via the conductive hard mask, and wherein the conductive hard mask comprises a portion having a second thickness different from the first thickness.

2. The memory cell apparatus of claim 1, further comprising:
   a sealant coupled with the first memory element, the first electrode, and at least a portion of the conductive hard mask, wherein the sealant comprises a different material than the conductive hard mask.

3. The memory cell apparatus of claim 1, further comprising:
   at least one interconnect.

4. A memory cell apparatus, comprising:
   a first memory element that comprises a variable resistance material;
   a first electrode coupled with the first memory element;
   at least a portion of a conductive hard mask coupled with the first electrode;
   a conductive line coupled with the first electrode via the conductive hard mask, wherein the conductive hard mask comprises a portion having a first thickness;
   a second memory element that comprises the variable resistance material; and
   a second electrode coupled with the second memory element, wherein the conductive line is coupled directly to the second electrode.

5. The memory cell apparatus of claim 1, wherein the conductive hard mask and the conductive line comprise a same material.

6. The memory cell apparatus of claim 1, wherein the conductive hard mask comprises at least one of tungsten, aluminum, titanium, titanium nitride, silicon, or any combination thereof.

7. A memory cell apparatus, comprising:
   a first memory element that comprises a variable resistance material;
   a first electrode coupled with the first memory element; and
   at least a portion of a conductive hard mask coupled with the first electrode, wherein the conductive hard mask comprises a set of sublayers, wherein each sublayer of the set comprises a different conductive material.

8. The memory cell apparatus of claim 1, wherein the variable resistance material comprises a chalcogenide material.

9. The memory cell apparatus of claim 4, further comprising:
   a sealant coupled with the first memory element, the first electrode, and at least a portion of the conductive hard mask, wherein the sealant comprises a different material than the conductive hard mask.

10. The memory cell apparatus of claim 4, further comprising:
    at least one interconnect.

11. The memory cell apparatus of claim 4, wherein the conductive hard mask and the conductive line comprise a same material.

12. The memory cell apparatus of claim 4, wherein the conductive hard mask comprises at least one of tungsten, aluminum, titanium, titanium nitride, silicon, or any combination thereof.

13. The memory cell apparatus of claim 4, wherein the variable resistance material comprises a chalcogenide material.

14. The memory cell apparatus of claim 4, wherein the conductive hard mask comprises a set of sublayers, wherein each sublayer of the set comprises a different conductive material.

15. The memory cell apparatus of claim 7, further comprising:
    a sealant coupled with the first memory element, the first electrode, and at least a portion of the conductive hard mask, wherein the sealant comprises a different material than the conductive hard mask.

16. The memory cell apparatus of claim 7, further comprising:
at least one interconnect.

17. The memory cell apparatus of claim 7, wherein the conductive hard mask comprises at least one of tungsten, aluminum, titanium, titanium nitride, silicon, or any combination thereof.

18. The memory cell apparatus of claim 7, wherein the variable resistance material comprises a chalcogenide material.

19. The memory cell apparatus of claim 7, further comprising:
a conductive line coupled with the first electrode via the conductive hard mask, wherein the conductive hard mask comprises a portion having a first thickness.

20. The memory cell apparatus of claim 19, wherein the conductive hard mask and the conductive line comprise a same material.

* * * * *